United States Patent
Wang et al.

(10) Patent No.: US 11,158,643 B2
(45) Date of Patent: Oct. 26, 2021

(54) NON-VOLATILE MEMORY BIT CELLS WITH NON-RECTANGULAR FLOATING GATES

(71) Applicant: GLOBALFOUNDRIES Singapore Pte. Ltd., Singapore (SG)

(72) Inventors: Lanxiang Wang, Singapore (SG); Shyue Seng Tan, Singapore (SG); Kiok Boone Elgin Quek, Singapore (SG); Xinshu Cai, Singapore (SG); Eng Huat Toh, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 39 days.

(21) Appl. No.: 16/695,725

(22) Filed: Nov. 26, 2019

(65) Prior Publication Data
US 2021/0159234 A1 May 27, 2021

(51) Int. Cl.
*H01L 27/11519* (2017.01)
*H01L 27/11521* (2017.01)

(52) U.S. Cl.
CPC .. *H01L 27/11519* (2013.01); *H01L 27/11521* (2013.01)

(58) Field of Classification Search
CPC ......... H01L 27/11519; H01L 27/11521; H01L 27/11558; H01L 27/1156; H01L 29/42324; H01L 29/42328; H01L 29/788
See application file for complete search history.

(56) References Cited

U.S. PATENT DOCUMENTS

| 7,099,192 | B2 | 8/2006 | Wang et al. |
| 7,471,570 | B2 * | 12/2008 | Morton ............... G11C 16/3418 365/185.28 |
| 7,939,861 | B2 * | 5/2011 | Horch .................... G11C 16/06 257/249 |
| 11,069,713 | B2 | 7/2021 | Takahashi et al. |

FOREIGN PATENT DOCUMENTS

TW          201810536 A      3/2018

OTHER PUBLICATIONS

Taiwan Intellectual Property Office, Examination Report received in Taiwanese Patent Application No. 109137095 dated Aug. 12, 2021.

* cited by examiner

*Primary Examiner* — Allison Bernstein
(74) *Attorney, Agent, or Firm* — Thompson Hine LLP

(57) ABSTRACT

Structures for a non-volatile memory bit cell and methods of forming a structure for a non-volatile memory bit cell. A field-effect transistor has a channel region and a first gate electrode positioned over the channel region. A capacitor includes a second gate electrode that is coupled to the first gate electrode to define a floating gate. The first gate electrode has a non-rectangular shape.

20 Claims, 5 Drawing Sheets

NON-VOLATILE MEMORY BIT CELLS WITH NON-RECTANGULAR FLOATING GATES

BACKGROUND

The present invention relates to integrated circuits and semiconductor device fabrication and, more specifically, to structures for a non-volatile memory bit cell and methods of forming a structure for a non-volatile memory bit cell.

Non-volatile memories are utilized in various electronic products, such as cellular telephones. One-Time-Programmable (OTP) memory and Multiple-Time-Programmable (MTP) memory are common types of non-volatile memories. A major difference between these types of non-volatile memory is that an MTP memory is capable of being repeatedly programmed and erased, which contrasts with an OTP memory that can only be programmed a single time. A general disadvantage of conventional OTP memories and MTP memories is that their programming efficiency scales with device size, which may result in a relatively-large device size in order to provide satisfactory programming efficiency. During fabrication, one or more additional implantation masks may be needed to optimize the cell junction in order to improve programming efficiency, which adds to fabrication complexity.

Improved structures for a non-volatile memory bit cell and methods of forming a structure for a non-volatile memory bit cell are needed.

SUMMARY

According to an embodiment of the invention, a structure for a non-volatile memory bit cell is provided. The structure includes a field-effect transistor having a channel region and a first gate electrode positioned over the channel region. The structure further includes a capacitor having a second gate electrode. The second gate electrode is coupled to the first gate electrode to define a floating gate, and the first gate electrode has a non-rectangular shape.

According to another embodiment of the invention, a method of forming a structure for a non-volatile memory bit cell is provided. The method includes forming a field-effect transistor including a channel region and a first gate electrode positioned over the channel region, and forming a capacitor including a second gate electrode. The second gate electrode is coupled to the first gate electrode to define a floating gate, and the first gate electrode has a non-rectangular shape.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
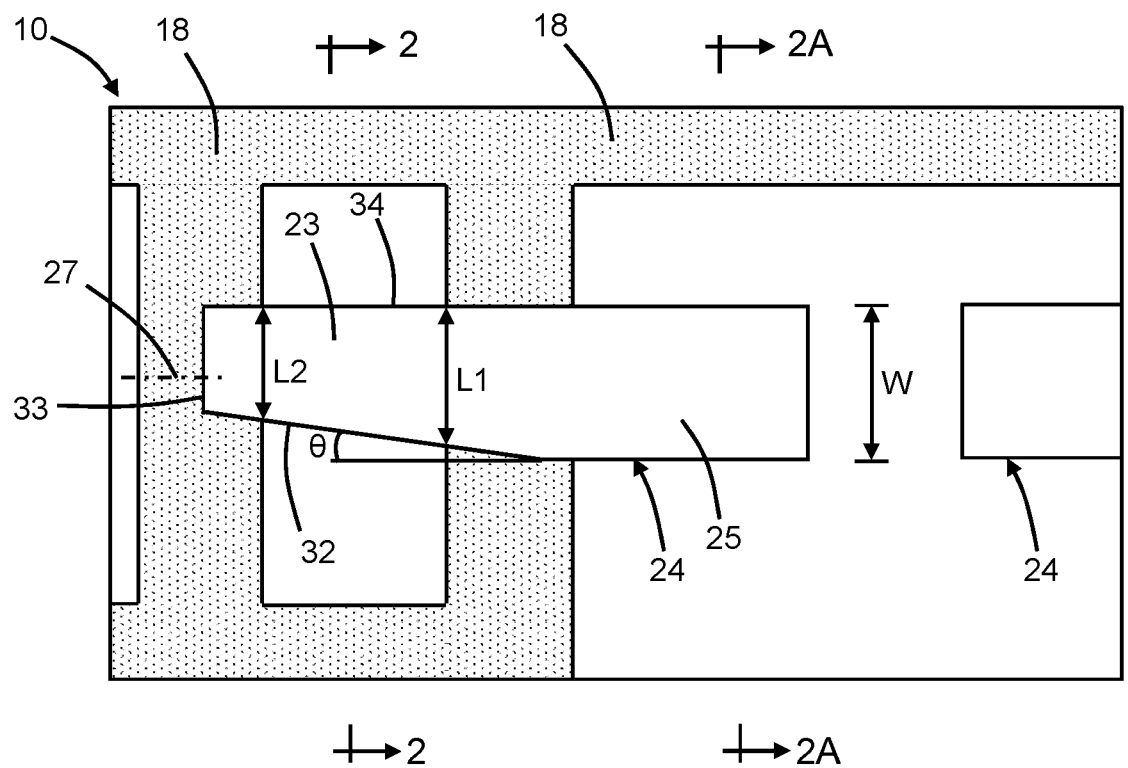
FIG. 1 is a top view of a non-volatile memory structure in accordance with embodiments of the invention.
Figure 2:
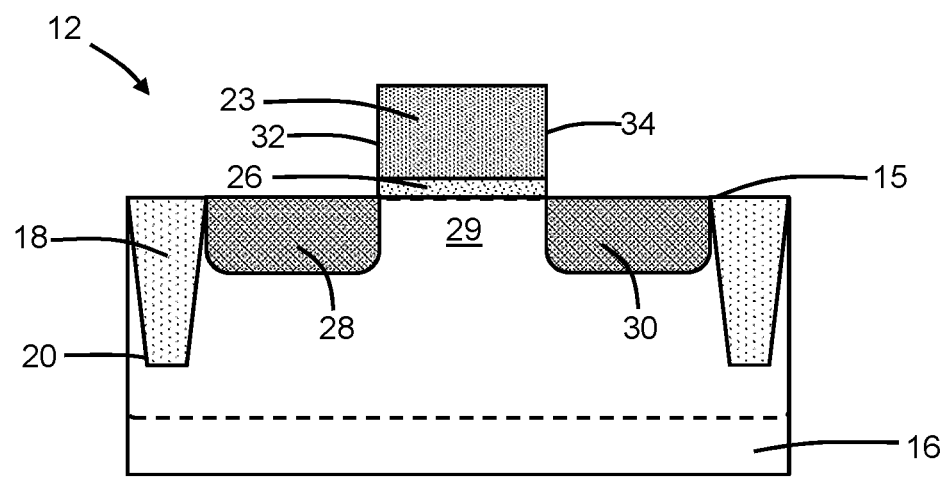
FIG. 2 is a cross-sectional view taken generally along line 2-2 in FIG. 1.
Figure 2A:
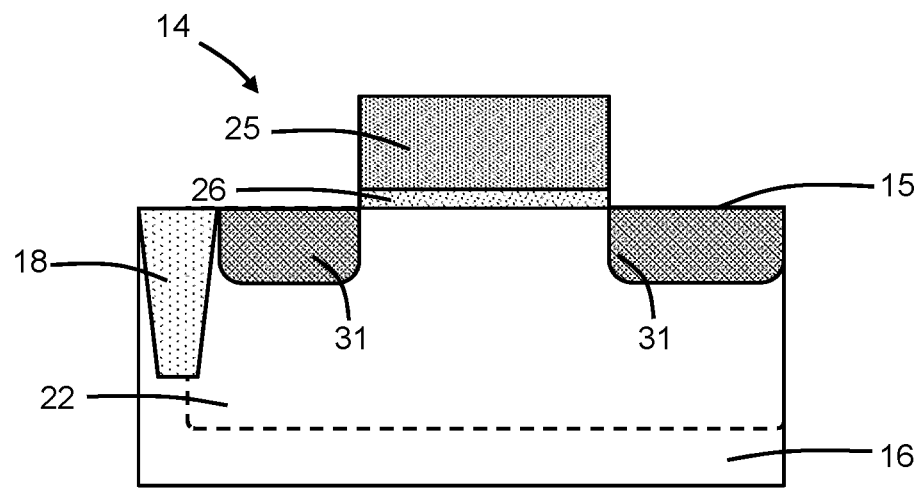
FIG. 2A is a cross-sectional view taken generally along line 2A-2A in FIG. 1.

With reference to FIGS. 1, 2, 2A and in accordance with embodiments of the invention, a structure 10 for a non-volatile memory bit cell includes a field-effect transistor 12 and a capacitor 14 that are formed using a substrate 16. The substrate 16 may be composed of a monocrystalline or single-crystal semiconductor material, such as single-crystal silicon, and may be a bulk wafer composed of a single-crystal semiconductor material (e.g., single-crystal silicon). Shallow trench isolation regions 18 are formed in trenches that extend from a top surface 15 of the substrate 16 to a shallow depth into the substrate 16. The shallow trench isolation regions 18 may be composed of a dielectric material, such as silicon dioxide, deposited into trenches patterned by lithography and etching processes in the substrate 16 and then planarized. The semiconductor material of the substrate 16 may be doped with a dopant, such as a p-type dopant, to form a well 20 beneath the field-effect transistor 12. The semiconductor material of the substrate 16 may be doped with a dopant, such as an n-type dopant, to form a well 22 beneath the capacitor 14. The wells 20, 22, which have opposite conductivity types, may be formed by, for example, separate masked ion implantations.

The field-effect transistor 12 and the capacitor 14 share a floating gate 24 that extends along a longitudinal axis 27 over and across the top surface 15 of the substrate 16 and shallow trench isolation regions 18. The floating gate 24 may be composed of heavily-doped polysilicon (i.e., polycrystalline silicon) that is deposited as a layer over the top surface 15 of the substrate 16 and shallow trench isolation regions 18 and then patterned with lithography and etching processes. The floating gate 24 includes a gate electrode 23 that is associated with the field-effect transistor 12 and a gate electrode 25 that is associated with the capacitor 14. In an embodiment, the gate electrodes 23, 25 may have different geometrical shapes. The floating gate 24 is surrounded at its perimeter by a sidewall spacer, which is not shown for purposes of clarity of illustration. The gate electrode 23 may include side surfaces 32, 34 that extend away from the top surface 15 of the substrate 16 and shallow trench isolation regions 18, as well as an end surface 33 that connects the side surfaces 32, 34.

A gate dielectric layer 26 may be arranged between the top surface 15 of the substrate 16 and the floating gate 24. In an embodiment, the gate dielectric layer 26 may be composed of silicon dioxide. In an alternative embodiment, the gate dielectric layer 26 may be composed of a high-k dielectric material, such as hafnium oxide or tantalum oxide, having a dielectric constant (i.e., permittivity) greater than or equal to about four (4).

The field-effect transistor 12 includes a source/drain region 28 and a source/drain region 30 that are located in the well 20. As used herein, the term "source/drain region" means a region of semiconductor material that can function as either a source or a drain of a field-effect transistor. In an embodiment, the source/drain region 28 may provide a source of the field-effect transistor 12 and the source/drain region 30 may provide a source of the field-effect transistor 12.

The source/drain regions 28, 30 are located adjacent to the opposite side surfaces 32, 34 of the gate electrode 23. The source/drain regions 28, 30 may be positioned beneath the top surface 15 of the substrate 16. The source/drain regions 28, 30 are doped to have an opposite conductivity type from the well 22. In an embodiment, the semiconductor material of the source/drain regions 28, 30 may be doped with an n-type dopant (e.g., phosphorus and/or arsenic) that provides n-type conductivity. In an embodiment, the source/drain regions 28, 30 may be formed by an ion implantation process that is self-aligned by the gate electrode 23. A channel region 29 is located in the substrate 16 laterally between the source/drain regions 28, 30 and beneath the gate electrode 23. The channel region 29 is provided by a portion of the well 22 that is masked by the gate electrode 23 when the source/drain regions 28, 30 are formed.

The semiconductor material of the substrate 16 may be doped with a dopant, such as an n-type dopant, to form a doped region 31 in the well 22. The doped region 31, which has the same conductivity type as the well 22, provides a plate of the capacitor 14. The doped region 31 may be concurrently formed by ion implantation along with the source/drain regions 28, 30 and may be self-aligned by the gate electrode 25. The capacitor 14 may be one of several capacitors that share the doped region 31 and that are paired with surrounding field-effect transistors like field-effect transistor 12.

The gate electrode 23 associated with the field-effect transistor 12 and the gate electrode 25 associated with the capacitor 14 may converge at a location over one of the shallow trench isolation regions 18. Due at least in part to their concurrent formation, the gate electrodes 23, 25 may have equal or substantially equal thicknesses in a vertical direction.

The gate electrode 23 has a non-rectangular shape characterized by a perimeter that includes the side surfaces 32, 34 and end surface 33. In an embodiment, the side surface 32 of the gate electrode 23 may be inclined or sloped at an angle, θ, relative to the longitudinal axis 27. The tapering of the side surface 32 may be formed when the gate electrode 23 of the floating gate 24 is patterned. The gate electrode 23 is asymmetrical relative to the longitudinal axis 27 because the side surface 32 is the only one of the side surfaces 32, 34 to be sloped. In that regard, the side surface 32 is not aligned parallel to the side surface 34 nor to the longitudinal axis 27 due to its tapering. The side surface 32 of the gate electrode 23 may extend fully across the channel region 29 and may be positioned in part over both of the shallow trench isolation regions 18 on opposite sides adjacent to the channel region 29.

The gate electrode 23 has a width, W, that varies with position along the longitudinal axis 27, and the minimum width of the gate electrode 23 may be located at the end surface 33 and over one of the trench isolation regions 18. In an embodiment, the width of the gate electrode 23 may be less than or equal to the width of the gate electrode 25. The gate electrode 23 associated with the field-effect transistor 12 is characterized by multiple gate lengths in a range from a gate length, L1, to a gate length, L2, that is less than the gate length, L1. The size reduction of the gate electrode 23 due to the tapered side surface 32 may enhance channel hot carrier effects associated with the field-effect transistor 12 and improve the programming efficiency of the structure 10 while enabling a smaller bit cell size. The inclination or slope of the side surface 32 (i.e., the value of the angle, θ) may be adjusted to optimize the hot carrier effects in the channel region 29 during operation and, thereby, to optimize the programming efficiency.

Middle-of-line (MOL) processing and back-end-of-line (BEOL) processing follow, which includes formation of silicide, contacts, vias, and wiring for an interconnect structure coupled with the field-effect transistor 12 and the capacitor 14.

Figure 3:
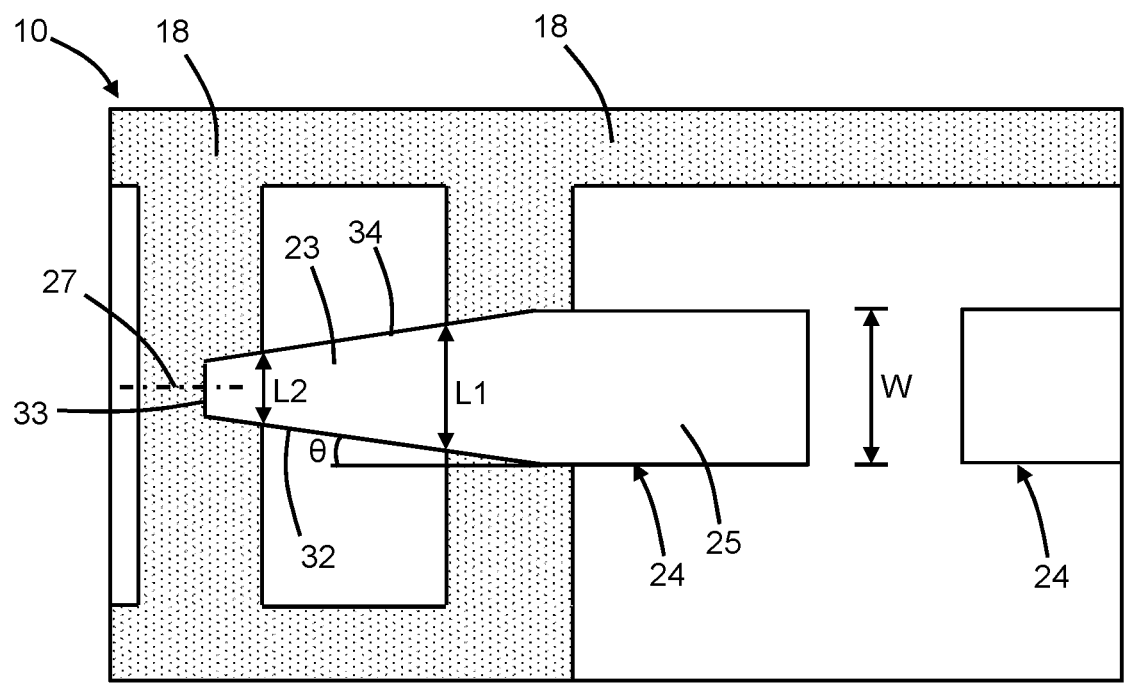
FIGS. 3-9 are top views of non-volatile memory structures in accordance with alternative embodiments of the invention.

With reference to FIG. 3 in which like reference numerals refer to like features in FIG. 1 and in accordance with alternative embodiments of the invention, both of the side surfaces 32, 34 of the gate electrode 23 may be inclined or sloped at an angle, θ, relative to the longitudinal axis 27. The gate electrode 23 may be symmetrical relative to the longitudinal axis 27 due to the tapering of both side surfaces 32, 34 at equal angles or, alternatively, at substantially equal angles. In that regard, the side surfaces 32, 34 are not aligned parallel to each other nor to the longitudinal axis 27 due to the tapering. The tapering of the side surfaces 32, 34 may be formed when the gate electrode 23 of the floating gate 24 is patterned. The side surfaces 32, 34 of the gate electrode 23 may extend across the channel region 29 and may be positioned in part over both of the shallow trench isolation regions 18 adjacent to the channel region 29. The gate electrode 23 has a width, W, that varies with position along the longitudinal axis, and the minimum width is located at the end surface 33 and over one of the trench isolation regions 18. The gate electrode 23 associated with the field-effect transistor 12 is characterized by multiple gate lengths that vary from a gate length, L1, to a gate length, L2, that is less than the gate length, L1.

Figure 4:
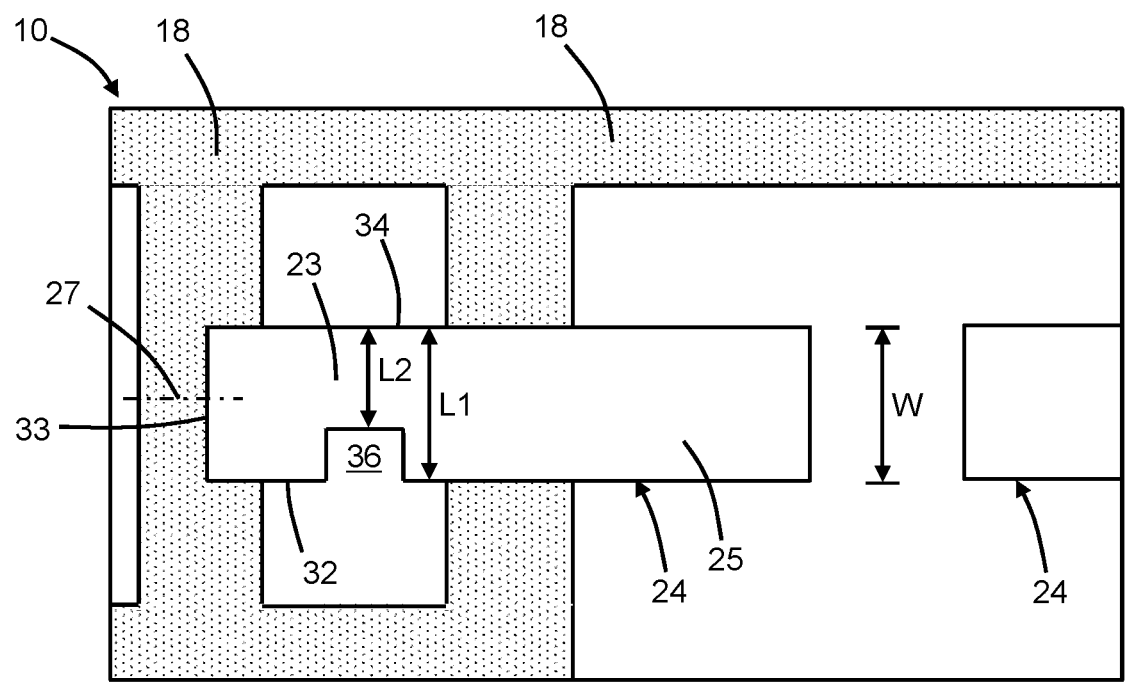

With reference to FIG. 4 in which like reference numerals refer to like features in FIG. 1 and in accordance with alternative embodiments of the invention, the side surface 32 of the gate electrode 23 may include a notch 36 as a cut that is located over the channel region 29. The notch 36 extends through the full thickness of the gate electrode 23 and defines an inward irregularity in the side surface 32 that interrupts its smoothness. The notch 36, which may be rectangular in shape, does not extend laterally over either of the adjacent shallow trench isolation regions 18 and is fully positioned over the channel region 29. The notch 36 in the side surface 32 may be formed when the gate electrode 23 of the floating gate 24 is patterned. The minimum width of the gate electrode 23 is located over the channel region 29 due to the location of the notch 36. The gate electrode 23 associated with the field-effect transistor 12 is characterized by multiple gate lengths, namely a gate length, L1, and a gate length, L2, that is less than the gate length, L1, attributable to the notch 36 in the gate electrode 23.

Figure 5:
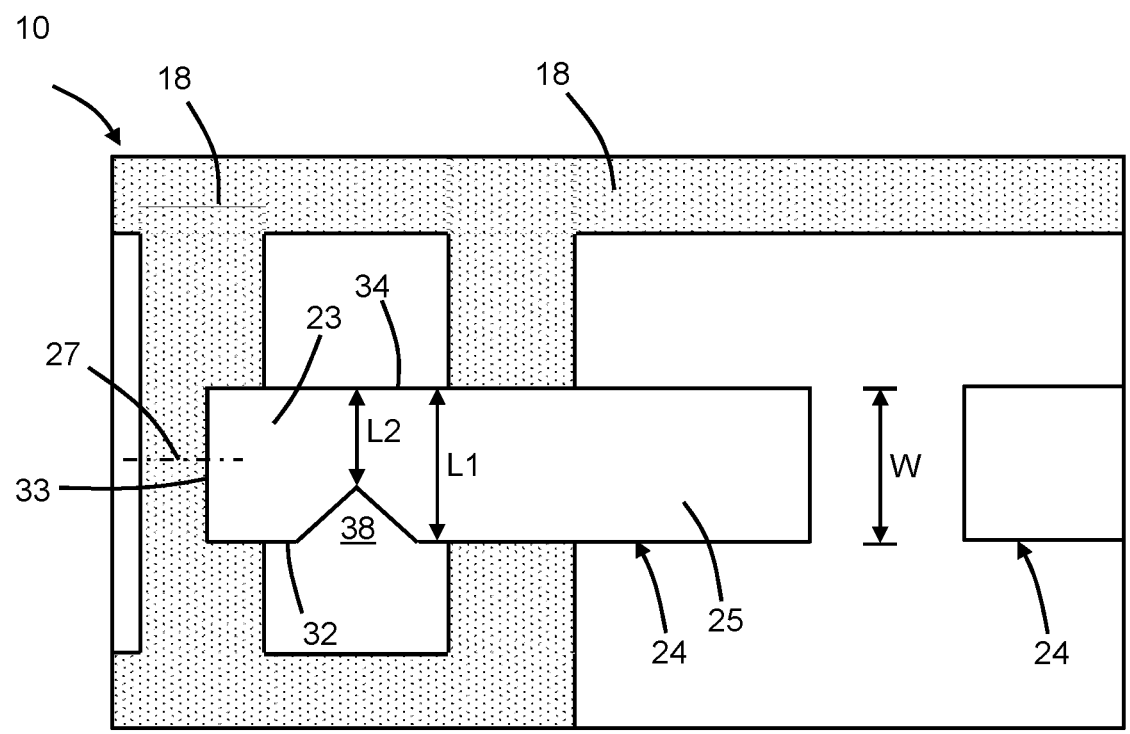

With reference to FIG. 5 in which like reference numerals refer to like features in FIG. 1 and in accordance with alternative embodiments of the invention, the side surface 32 of the gate electrode 23 may include a notch 38 as a cut that is located over the channel region 29. The notch 38 extends through the full thickness of the gate electrode 23, and defines an inward irregularity in the side surface 32 that interrupts its smoothness. The notch 38, which may have a non-rectangular shape such as a V-shape, does not extend over either of the adjacent shallow trench isolation regions 18 and is fully positioned over the channel region 29. The notch 38 in the side surface 32 may be formed when the gate electrode 23 of the floating gate 24 is patterned. The minimum width of the gate electrode 23 is located over the channel region 29 due to the location of the notch 38. The gate electrode 23 associated with the field-effect transistor 12 is characterized by multiple gate lengths, namely in a ranged from a gate length, L1, to a gate length, L2, that is less than the gate length, L1, attributable to the notch 38 in the gate electrode 23.

Figure 6:
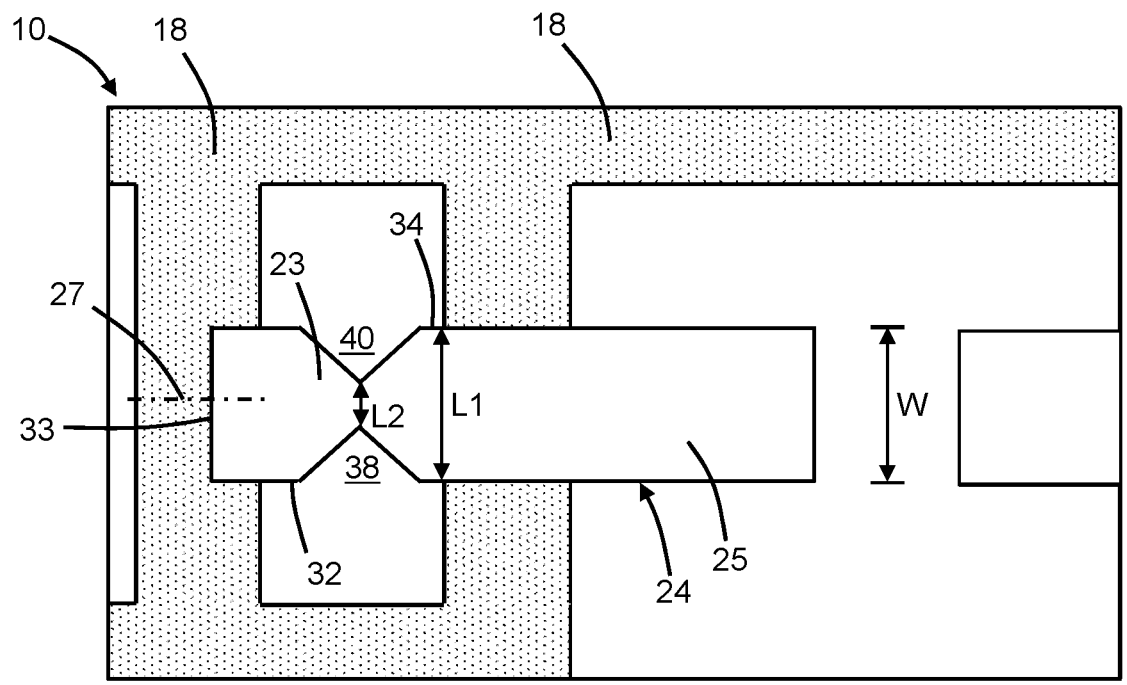

With reference to FIG. 6 in which like reference numerals refer to like features in FIG. 5 and in accordance with alternative embodiments of the invention, the side surface 34 of the gate electrode 23 may include, in addition to the notch 38 in the side surface 32, a notch 40 as a cut that is located over the channel region 29. The notch 40, which may have a non-rectangular shape such as a V-shape, does not extend over either of the adjacent shallow trench isolation regions 18 and is fully positioned over the channel region 29. The notches 38, 40 each extend through the full thickness of the gate electrode 23, the notch 38 defines an inward irregularity in the side surface 32 that interrupts its smoothness, and the notch 40 defines an inward irregularity in the side surface 34 that interrupts its smoothness. Both of the side surfaces 32, 34 are notched in connection with this embodiment. In an alternative embodiment, the notches 38, 40 may have a rectangular shape similar to notch 36 (FIG. 5). The notch 38 in the side surface 32 and the notch 40 in the side surface 34 may be formed when the gate electrode 23 of the floating gate 24 is patterned. The minimum width of the gate electrode 23 is located over the channel region 29 due to the location of the notches 38, 40. The gate electrode 23 associated with the field-effect transistor 12 is characterized by a range of gate lengths from a gate length, L1, to a gate length, L2, that is less than the gate length, L1, attributable to the notches 38, 40 in the gate electrode 23.

Figure 7:
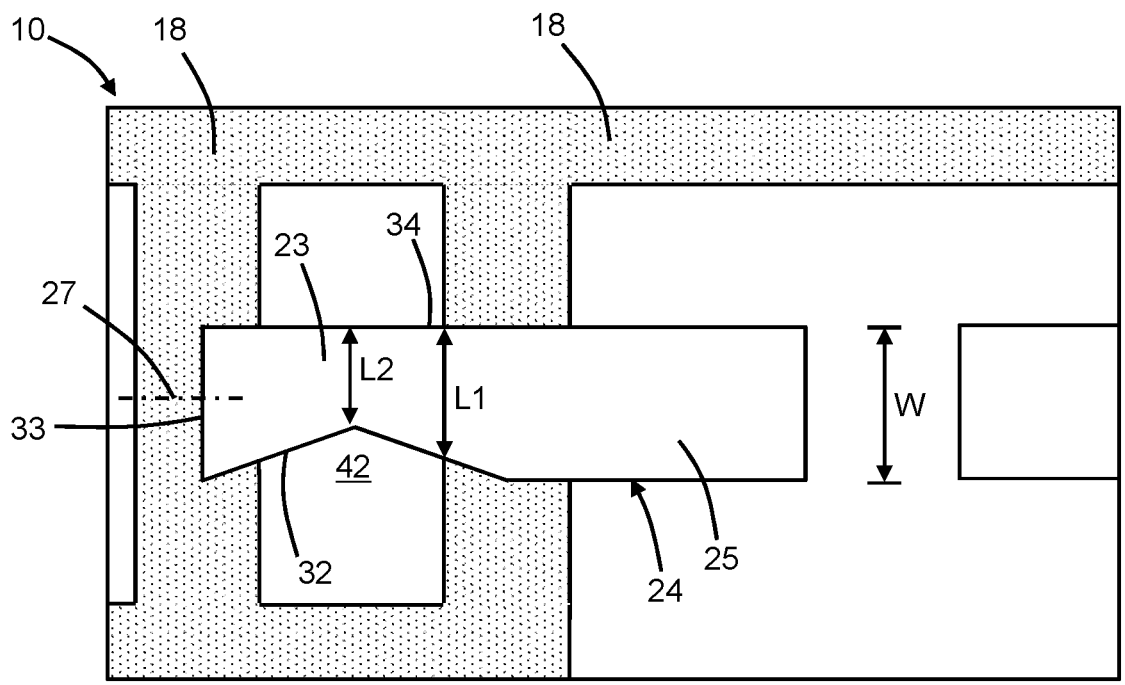

With reference to FIG. 7 in which like reference numerals refer to like features in FIG. 5 and in accordance with alternative embodiments of the invention, the side surface 32 of the gate electrode 23 may include a notch 42 as a cut that is located in part over the channel region 29. The notch 42 extends through the full thickness of the gate electrode 23 and defines an inward irregularity in the side surface 32 that interrupts it smoothness. The notch 42, which may have a non-rectangular shape such as a V-shape, extends fully across the channel region 29 and extends in part laterally to be positioned over both of the shallow trench isolation regions 18 adjacent to the channel region 29. The notch 42 in the side surface 32 may be provided when the gate electrode 23 of the floating gate 24 is patterned. The minimum width of the gate electrode 23 is located over the channel region 29 due to the location of the notch 42. The gate electrode 23 associated with the field-effect transistor 12 is characterized by multiple gate lengths ranging from a gate length, L1, to a gate length, L2, that is less than the gate length, L1, attributable to the notch 42 in the gate electrode 23.

Figure 8:
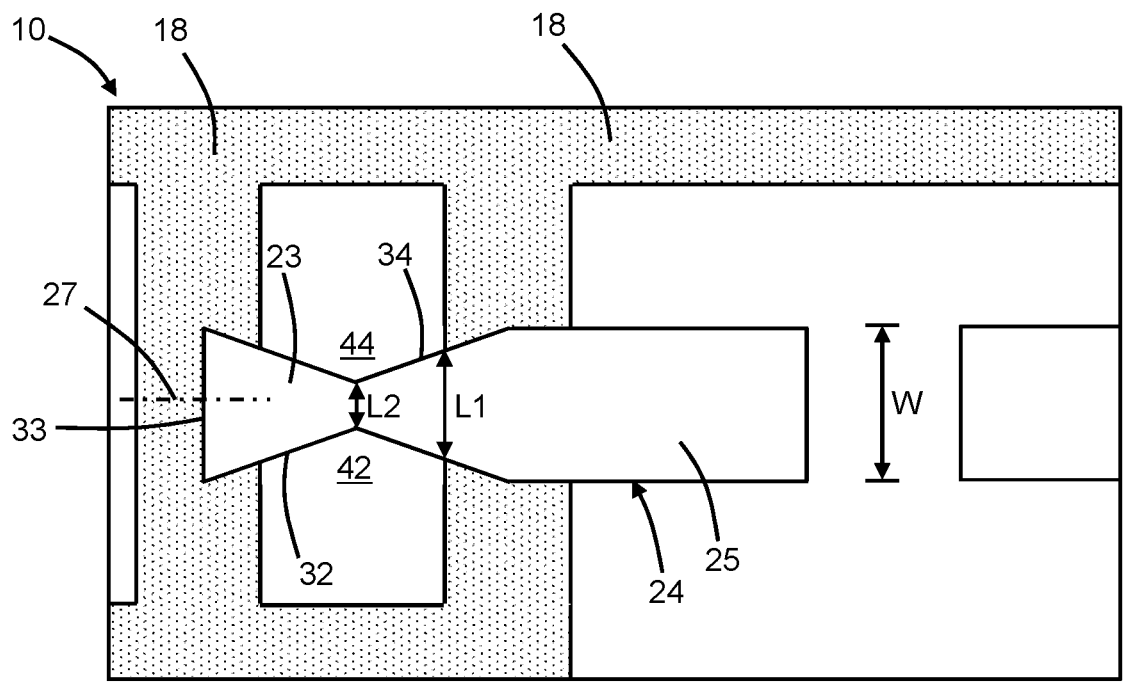

With reference to FIG. 8 in which like reference numerals refer to like features in FIG. 6 and in accordance with alternative embodiments of the invention, the side surface 34 of the gate electrode 23 may include, in addition to the notch 42 in the side surface 32, a notch 44 as a cut that is located in part over the channel region 29. The notches 42, 44 each extend through the full thickness of the gate electrode 23, the notch 42 defines an inward irregularity in the side surface 32 that interrupts its smoothness, and the notch 44 defines an inward irregularity in the side surface 34 that interrupts its smoothness. The notch 44, which may have a V-shape, extends fully across the channel region 29 and extends in part laterally to be positioned over both of the shallow trench isolation regions 18 adjacent to the channel region 29. Both side surfaces 32, 34 are notched in connection with this embodiment, and the gate electrode 23 may have a symmetrical shape relative to the longitudinal axis 27. The notch 42 in the side surface 32 and the notch 44 in the side surface 34 may be formed when the gate electrode 23 of the floating gate 24 is patterned. The minimum width of the gate electrode 23 is located over the channel region 29 due to the location of the notches 42, 44. The gate electrode 23 associated with the field-effect transistor 12 is characterized by multiple gate lengths ranging from a gate length, L1, to a gate length, L2, that is less than the gate length, L1, attributable to the notches 42, 44 in the gate electrode 23.

Figure 9:
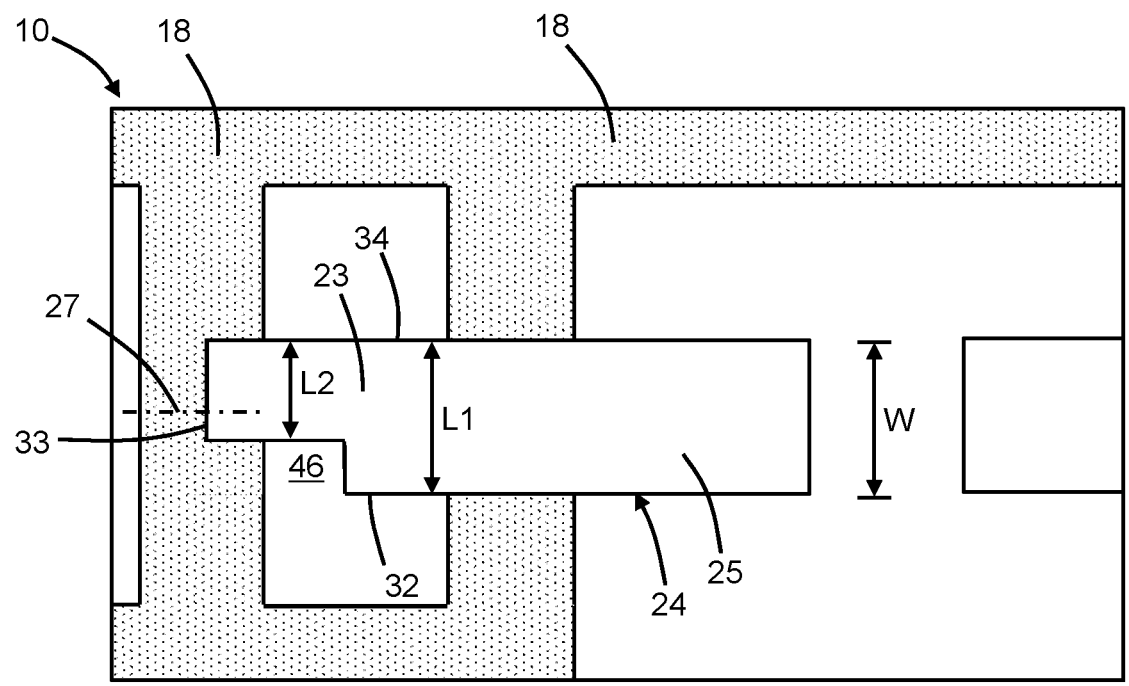

With reference to FIG. 9 in which like reference numerals refer to like features in FIG. 1 and in accordance with alternative embodiments of the invention, the side surface 32 of the gate electrode 23 may include a notch 46 as a cut that is positioned in part over the channel region 29 and in part over one of the shallow trench isolation regions 18. The notch 46 extends through the full thickness of the gate electrode 23 and defines an inward irregularity in the side surface 32 that interrupts its smoothness. The notch 46, which may have a rectangular shape, extends inward over the channel region 29 from the end surface 33 of the gate electrode 23, and effectively eliminates a corner of the gate electrode 23. The notch 46, which extends across a portion of the channel region 29, may be formed when the gate electrode 23 of the floating gate 24 is patterned. The gate electrode 23 associated with the field-effect transistor 12 is characterized by a gate length, L1, and a gate length, L2, that is less than the gate length, L1, because of the notch 46 in the gate electrode 23.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a non-volatile memory bit cell, the structure comprising:
a field-effect transistor including a first source/drain region, a second source/drain region, a channel region, and a first gate electrode positioned over the channel region, the channel region laterally between the first source/drain region and the second source/drain region, the first gate electrode including a first side surface and a second side surface, the first source/drain region adjacent to the first side surface, and the second source/drain region adjacent to the second side surface; and
a capacitor including a second gate electrode,
wherein the second gate electrode is coupled to the first gate electrode to define a floating gate, the first gate electrode and the second gate electrode are positioned along a longitudinal axis, the first side surface is angled relative to the longitudinal axis, the second side surface that is angled relative to the longitudinal axis, and the first side surface and the second side surface are angled with substantially equal angles such that the first gate electrode is symmetrical relative to the longitudinal axis.

2. The structure of claim 1 wherein the first gate electrode has a first gate length and a second gate length that is less than the first gate length.

3. The structure of claim 1 further comprising:
a shallow trench isolation region positioned between the field-effect transistor and the capacitor,
wherein the floating gate extends over the shallow trench isolation region to couple the first gate electrode to the second gate electrode.

4. The structure of claim 3 wherein the first side surface extends across the channel region and is positioned in part over the shallow trench isolation region, and the second side surface extends across the channel region and is positioned in part over the shallow trench isolation region.

5. The structure of claim 1 wherein the first gate electrode has an end surface that connects the first side surface and the second side surface, the first gate electrode has a width that varies with position along the longitudinal axis, and the width of the first gate electrode has a minimum at the end surface.

6. The structure of claim 1 further comprising:
a shallow trench isolation region positioned adjacent to the channel region,
wherein the first gate electrode has an end surface positioned over the shallow trench isolation region, the first side surface extends in part over the shallow trench isolation region to the end surface, and the second side surface extends in part over the shallow trench isolation region to the end surface.

7. The structure of claim 1 wherein the first gate electrode has an end surface that connects the first side surface and the second side surface, and the first side surface and the second side surface taper toward the end surface.

8. A structure for a non-volatile memory bit cell, the structure comprising:
a field-effect transistor including a first source/drain region, a second source/drain region, a channel region, and a first gate electrode positioned over the channel region, the channel region laterally between the first source/drain region and the second source/drain region, the first gate electrode including a first side surface and a second side surface, the first source/drain region adjacent to the first side surface, and the second source/drain region adjacent to the second side surface; and
a capacitor including a second gate electrode,
wherein the second gate electrode is coupled to the first gate electrode to define a floating gate, the first gate electrode and the second gate electrode are positioned along a longitudinal axis, the first gate electrode includes a first notch that extends into the first side surface and a second notch that extends into the second side surface and the first gate electrode has a symmetrical shape relative to the longitudinal axis.

9. The structure of claim 8 wherein the first notch and the second notch each have a rectangular shape.

10. The structure of claim 8 wherein the first notch and the second notch each have a V-shape.

11. The structure of claim 8 wherein the first notch and the second notch are each positioned fully over the channel region.

12. The structure of claim 8 further comprising:
a shallow trench isolation region positioned between the field-effect transistor and the capacitor,
wherein the first notch extends across the channel region and is positioned in part over the shallow trench isolation region, and the second notch extends across the channel region and is positioned in part over the shallow trench isolation region.

13. The structure of claim 8 wherein the first gate electrode has a first gate length and a second gate length that is less than the first gate length.

14. The structure of claim 8 further comprising:
a shallow trench isolation region positioned adjacent to the channel region,
wherein the first gate electrode has an end surface positioned over the shallow trench isolation region, the first notch extends across the channel region to the end surface, and the second notch extends across the channel region to the end surface.

15. The structure of claim 8 further comprising:
a shallow trench isolation region positioned between the field-effect transistor and the capacitor,
wherein the floating gate extends over the shallow trench isolation region to couple the first gate electrode to the second gate electrode.

16. The structure of claim 15 wherein the first notch extends across the channel region and is positioned in part over the shallow trench isolation region, and the second notch extends across the channel region and is positioned in part over the shallow trench isolation region.

17. A method of forming a structure for a non-volatile memory bit cell, the structure comprising:
forming a field-effect transistor including a first source/drain region, a second source/drain region, a channel region, and a first gate electrode positioned over the channel region, the channel region laterally between the first source/drain region and the second source/drain region, the first gate electrode including a first side surface and a second side surface, the first source/ drain region adjacent to the first side surface, and the second source/drain region adjacent to the second side surface; and forming a capacitor including a second gate electrode, wherein the second gate electrode is coupled to the first gate electrode to define a floating gate, the first gate electrode and the second gate electrode are positioned along a longitudinal axis, the first side surface is angled relative to the longitudinal axis, the second side surface that is angled relative to the longitudinal axis, and the first side surface and the second side surface are angled with substantially equal angles such that the first gate electrode is symmetrical relative to the longitudinal axis.

18. The method of claim 17 further comprising:

forming a shallow trench isolation region positioned between the field-effect transistor and the capacitor, wherein the floating gate extends over the shallow trench isolation region to couple the first gate electrode to the second gate electrode.

19. The method of claim 17 wherein the first gate electrode has a first gate length and a second gate length that is less than the first gate length.

20. The method of claim 17 wherein the first gate electrode and the second gate electrode are concurrently formed.

* * * * *